(12) United States Patent
Han et al.

(10) Patent No.: US 7,282,420 B2
(45) Date of Patent: Oct. 16, 2007

(54) METHOD OF MANUFACTURING A FLASH MEMORY DEVICE

(75) Inventors: Kyoung Sik Han, Incheon-si (KR); Sang Wook Park, Seoul (KR); Sang Deok Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 62 days.

(21) Appl. No.: 11/301,866

(22) Filed: Dec. 13, 2005

(65) Prior Publication Data

US 2006/0252204 A1   Nov. 9, 2006

(30) Foreign Application Priority Data

May 3, 2005   (KR) ...................... 10-2005-0037105
Jun. 29, 2005   (KR) ...................... 10-2005-0057270

(51) Int. Cl.
*H01L 21/20* (2006.01)

(52) U.S. Cl. ...................... 438/381; 438/238; 438/745; 257/E21; 257/17; 257/229; 257/645; 257/659

(58) Field of Classification Search ................ 438/381, 438/238, 257, 289, 723, 724, 743, 744, 756, 438/757, 745, 680
See application file for complete search history.

(56) References Cited

U.S. PATENT DOCUMENTS

| | | | | |
|---|---|---|---|---|
| 5,494,838 A | * | 2/1996 | Chang et al. | ................ 438/381 |
| 5,856,223 A | * | 1/1999 | Wang | ................ 438/264 |
| 5,882,973 A | * | 3/1999 | Gardner et al. | ................ 438/279 |
| 6,143,606 A | * | 11/2000 | Wang et al. | ................ 438/257 |
| 6,362,048 B1 | * | 3/2002 | Huang | ................ 438/257 |
| 2005/0045939 A1 | * | 3/2005 | Park et al. | ................ 257/315 |

FOREIGN PATENT DOCUMENTS

| | | |
|---|---|---|
| JP | 2003-068889 | 3/2003 |
| KR | 10 2002-0032697 | 5/2002 |
| KR | 2002-0032697 | 5/2002 |
| KR | 2003-1954 | 1/2003 |
| KR | 10-2004-0019191 | 3/2004 |

OTHER PUBLICATIONS

Official action issued in corresponding Korean application No. 2005-37105 dated Jun. 26, 2006.

* cited by examiner

*Primary Examiner*—David Nhu
(74) *Attorney, Agent, or Firm*—Marshall Gerstein & Borun LLP

(57) ABSTRACT

A method of manufacturing a flash memory device wherein a stacked structure of an oxide and nitride or the reverse is applied to insulation spacers provided on sidewalls of gates for forming source/drain regions. After completing the source/drain regions, spacers are formed on sidewalls of the gates by using an oxide film as a contacting buffer, thus minimizing the interference between gates and reducing the stress to cells, overcoming the disturbance of threshold voltage.

10 Claims, 7 Drawing Sheets

METHOD OF MANUFACTURING A FLASH MEMORY DEVICE

BACKGROUND

1. Field of the Invention

The invention relates generally to methods of manufacturing flash memory devices and, more particularly, to a method of manufacturing a flash memory device minimizing interference between gate lines, reducing stress to memory cells, and improving disturbance of threshold voltages.

2. Discussion of Related Art

In manufacturing transistors or flash memory devices, insulation spacers are formed on sidewalls of gate lines after constructing the gate lines. The insulation spacers are provided to prevent the gate lines from being connected to contact plugs that are subsequently formed. In addition, the insulation spacers are provided to ensure sufficient space between gate lines and source/drain regions in an ion implantation process for forming the source and drain regions in LVPMOS (low voltage PMOS) and LVNMOS (low voltage NMOS) fields. Unless the spaces between the gates lines and the source/drain regions are sufficiently defined, a short channel effect will be generated, which degrades electrical characteristics of the device.

The insulation spacer is usually made of an oxide film and a nitride film. When the spacer is formed of a nitride film, the nitride film is removed after forming source/regions through an ion implantation process. In this case, while there is an advantage of obtaining wider regions for source and drain contacts within the same area than in the case of using an oxide film alone, the nitride film remains at narrow spaces between the gate lines (specifically, wordlines of a NAND flash memory device). The dielectric constant of the nitride film is typically 6 to 8, which is larger than the dielectric constant of the oxide film (e.g., 3.6 to 3.9). Thus, an increase of interference effects between the gate lines and disturbance of threshold voltages results, which will be described in detail as follows.

FIGS. 1A and 1B are diagrams illustrating variations of threshold voltages in memory cells according to bias conditions of peripheral cells.

Referring to FIG. 1A, a string of a NAND flash memory device includes a drain selection transistor (not shown) connected in series between a bitline and a common source line, pluralities of memory cells (nine cells C13 through C21 are shown), and a source selection transistor (not shown). Here, 16, 32, or 64 memory cells are serially connected. This structure of the string is well known, so it will not be described in further detail.

In programming the 16th memory cell C16 in the structure of the string, a wordline assigned to the memory cell C16 is supplied with a pass voltage 10V. Also, a power source voltage or the pass voltage is applied to a selection line of the drain selection transistor and a source selection transistor, and 0V is applied to a bitline (not shown).

When the spacers are formed of the oxide film, the threshold voltage of the programmed memory cell C16 varies by about 0.144V due to interference from the pass voltage applied to the adjacent memory cells C15 and C17. Otherwise, when the spacers are formed of oxide and nitride films, the threshold voltage of the programmed memory cell C16 varies by 0.212V.

Referring to FIG. 1B, it can be seen that when the first memory cell C1 is programmed under the same condition, the interference by its adjacent memory cell C2 relatively decreases to lessen the variation of threshold voltage.

From the foregoing, it can be seen that the first memory cell C1 is less affected from the interference than is cell C16. Also, if the spacer includes a nitride film with a high dielectric constant, the effect of interference is more pronounced, to increase the variation in threshold voltage of the memory cell.

SUMMARY OF THE INVENTION

The invention is directed to a method of manufacturing a flash memory device capable of minimizing interference between gate lines, reducing stress to memory cells, and improving disturbance of threshold voltages.

In one aspect, the invention provides a method of manufacturing a flash memory device, including the steps of: forming first junction regions in active regions of a semiconductor substrate where source selection lines, wordlines, and drain selection lines are formed; forming first spacers with an insulation film on sidewalls of the source and drain selection lines, the insulation film filling spaces among the wordlines, between the wordline and the source selection line, and the wordline and the drain selection line; forming second spacers on the first spacers on the sidewalls of the source and drain selection lines; forming second junction regions in the first junction regions among the second spacers; and removing the second spacers.

In a preferred embodiment, the insulation film is formed of an oxide film.

In a preferred embodiment, the insulation film is formed with the least thickness necessary to fill the spaces among the wordlines, between the wordline and the source selection line, and the wordline and the drain selection line.

In a preferred embodiment, the second spacers are formed of a nitride film.

In a preferred embodiment, the respective thicknesses of the first and second spacers are established on a target distance between the second junction region and one of the source and drain selection lines.

In a preferred embodiment, the second spacers are removed by a wet etching process using phosphoric acid.

In another aspect the invention provides a method of manufacturing a flash memory device, including the steps of forming a low-concentration impurity region in a semiconductor substrate where pluralities of wordlines and selection lines are formed; forming a buffering nitride film entirely over the semiconductor substrate including the wordlines and the selection lines; forming oxide-film spacers on sidewalls of the selection lines by an etching process after forming an oxide film on the buffering nitride film; forming source/drain regions in predetermined areas of the semiconductor substrate by way of an ion implantation process with using the oxide-film spacers; removing the oxide-film spacers and the buffering nitride film; and forming contact-buffering oxide-film spacers on the sidewalls of selection lines, filling up spaces among the wordlines.

In a preferred embodiment, the oxide-film spacers are removed by a wet etching process with using an HF solution of $H_2O$ and HF mixed in a ratio of 50:1 through 110:1.

In a preferred embodiment, the oxide-film spacers are removed by a wet etching process with using an HF solution of $H_2O$ and BOE mixed in a ratio of 20:1 through 300:1.

In a preferred embodiment, the buffering nitride film is removed by a wet etching process with using phosphoric acid.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1A:
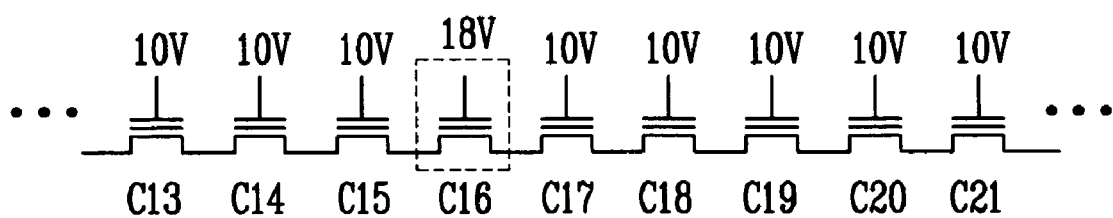
FIGS. 1A and 1B are diagrams illustrating variations of threshold voltages in memory cells according to bias conditions of peripheral cells.
Figure 1A:
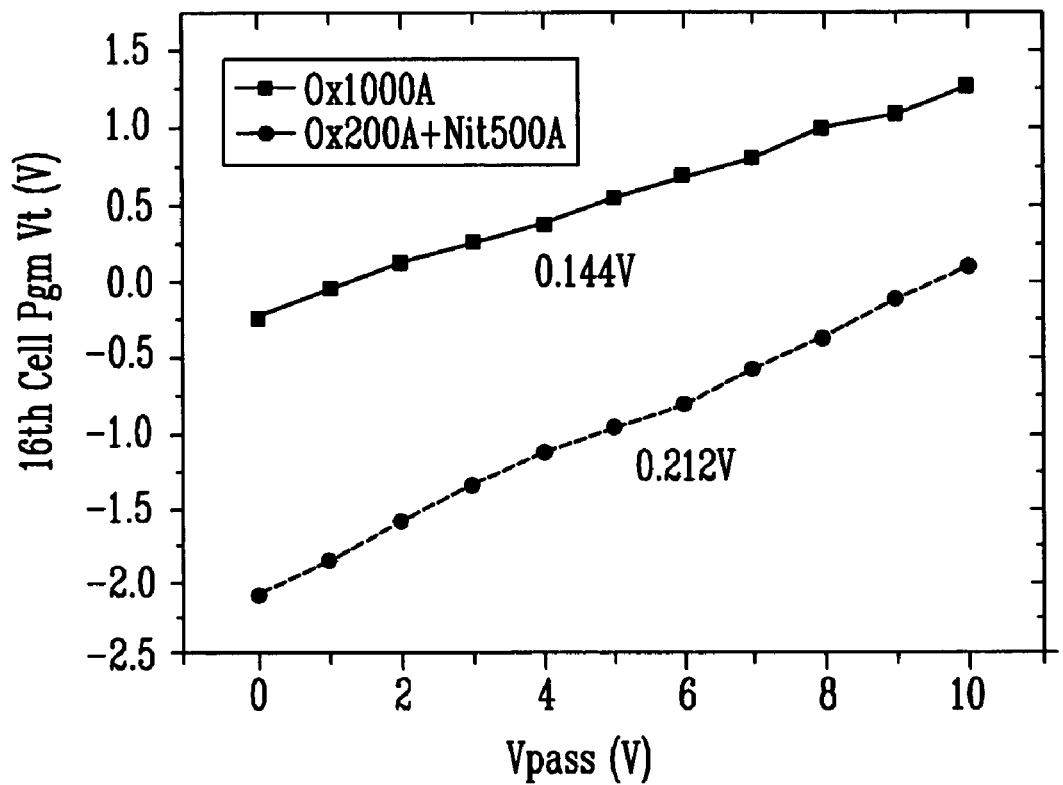
Figure 1B:
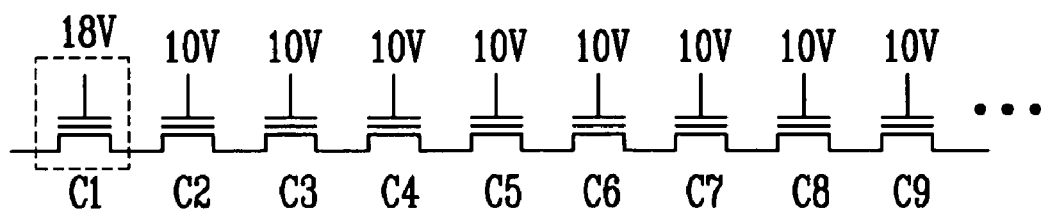
Figure 1B:
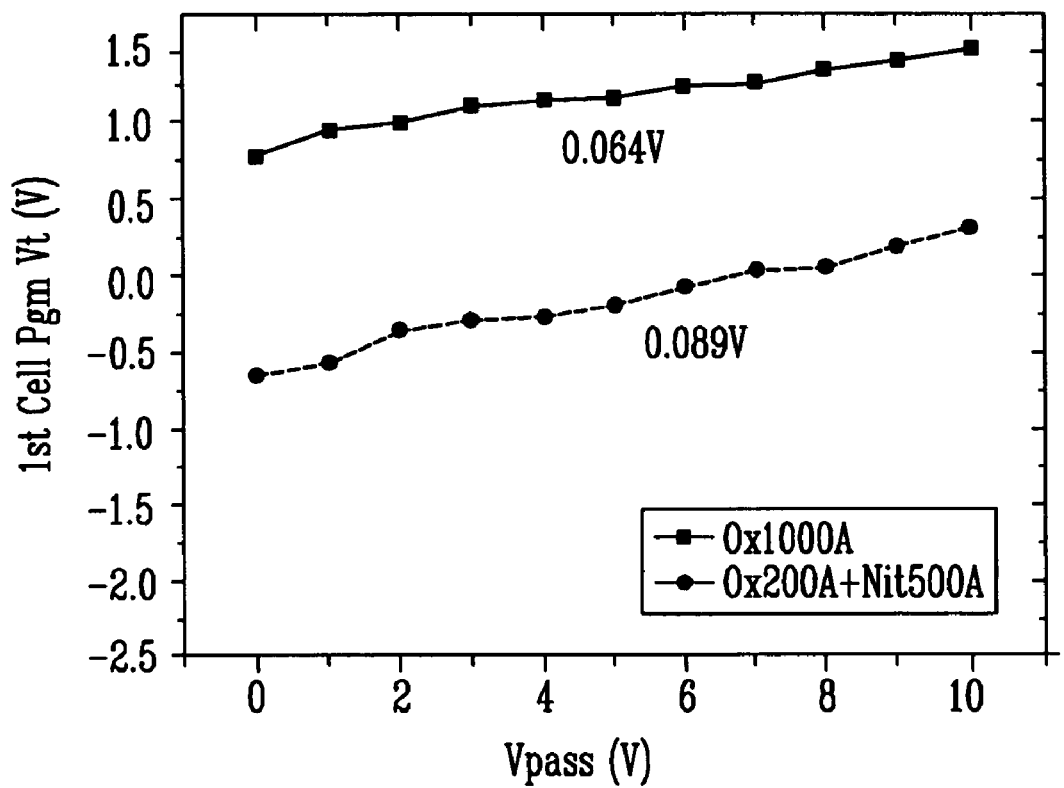

Preferred embodiments of the invention are described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

Hereinafter, it will be described about an exemplary embodiment of the invention in conjunction with the accompanying drawings.

FIGS. 2A through 2F are sectional diagrams illustrating processing steps by a method of manufacturing a flash memory device in accordance with a first embodiment of the invention.

Figure 2A:
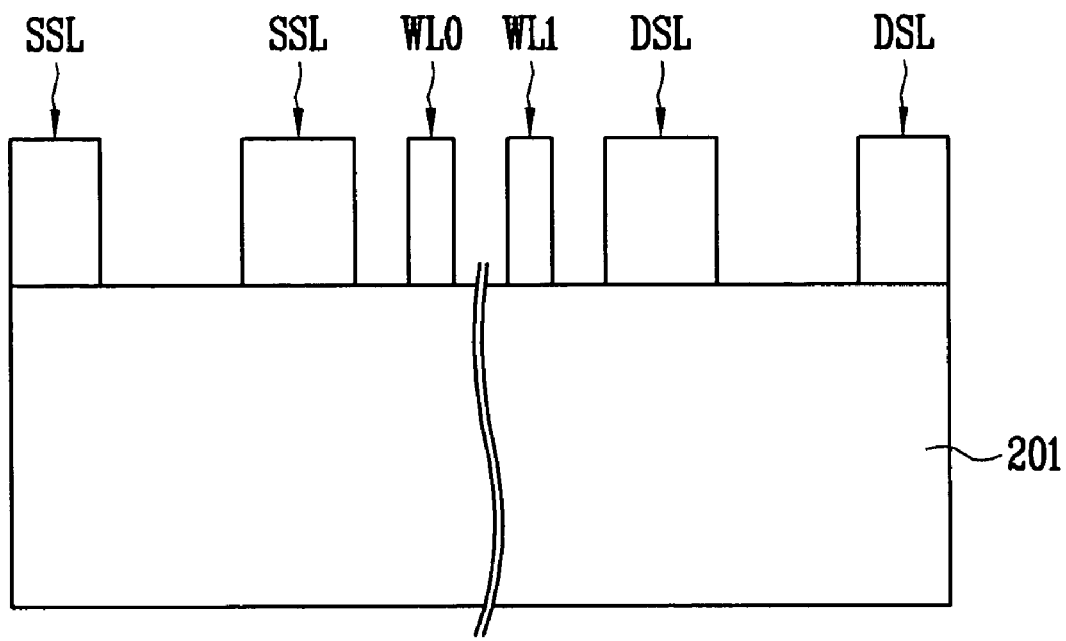
FIGS. 2A through 2F are sectional diagrams illustrating processing steps by a method of manufacturing a flash memory device in accordance with a first embodiment of the invention.

Referring to FIG. 2A, a source selection line SSL, wordlines WL0~WLn, and a drain selection line DSL are disposed in predetermined intervals to each other on a semiconductor substrate 201. Methods of forming the lines are well known in this technical field, and will not be described in detail.

Figure 2B:
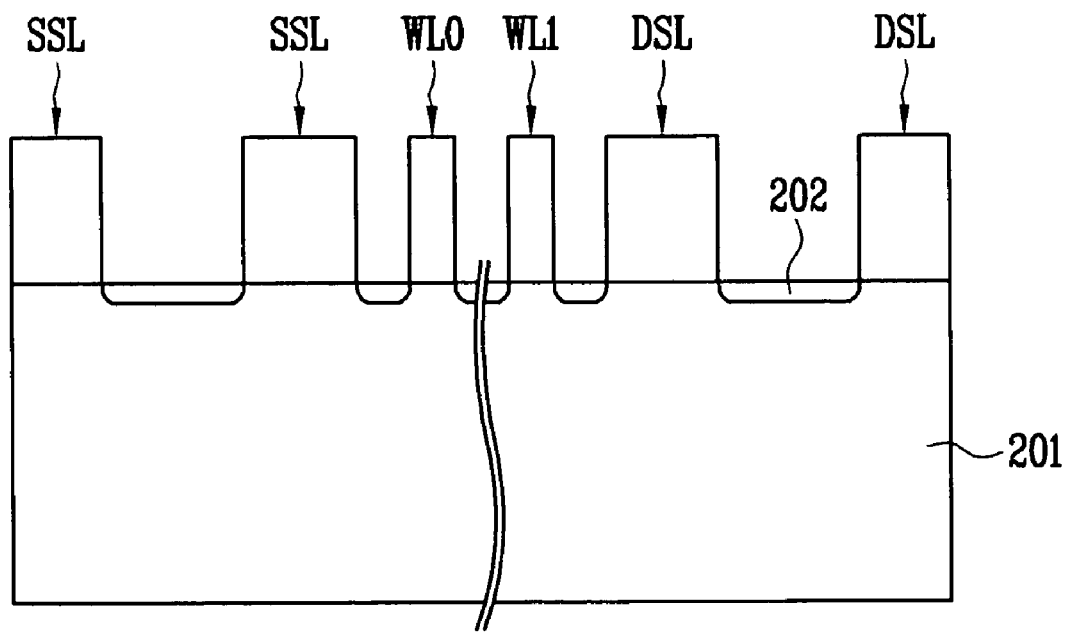

Referring to FIG. 2B, first junction regions 202, 202s, and 202d are formed in active regions of the semiconductor substrate 201. In detail, the first junction regions 202 are formed in the semiconductor substrate 201 between the wordlines WL0~WLn, between the wordline WL0 and the source selection line SSL, and between the wordline WLn and the drain selection lines DSL.

The first junction region 202s formed between the source selection lines SSL acts as a common source region while the first junction region 202d formed between the drain selection lines DSL acts as a source region connected to the bitline.

Figure 2C:
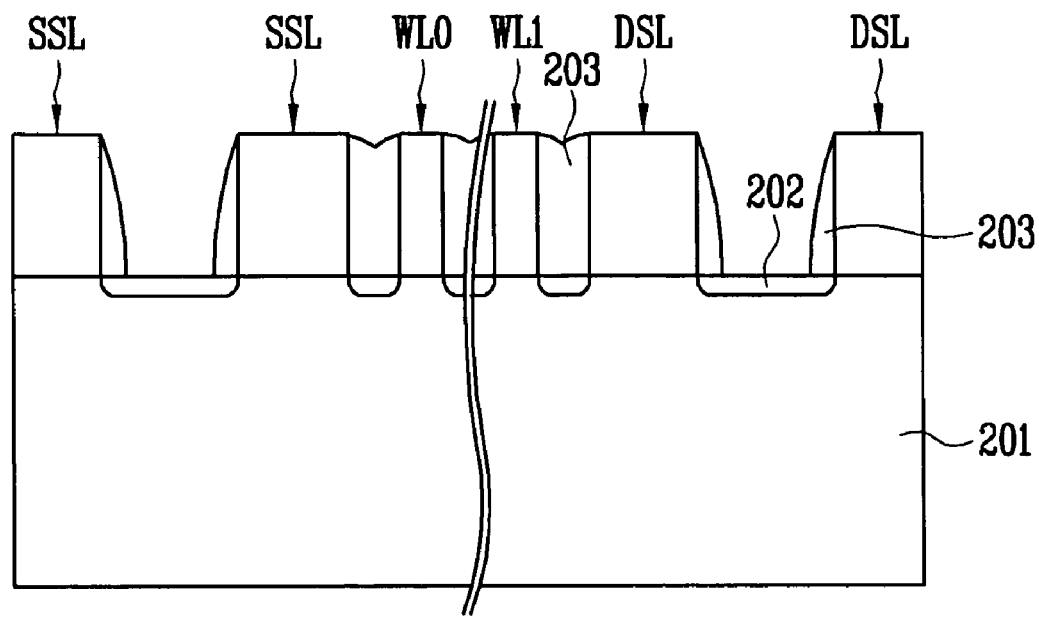

Referring to FIG. 2C, first spacers 203 are formed on sidewalls of the wordlines WL0~WLn, the source selection lines SSL, and the drain selection lines DSL.

In detail, an oxide film is formed in the minimum thickness capable of filling up spaces between the wordlines WL0~WLn. For example, the thickness of the oxide film is variable according to an integration density of the device, which may be formed in thickness of 100 Å through 1000 Å. A continuous blanket etch-back process is carried out to complete the structure of the first spacers 203 on the sidewalls of the source selection lines SSL and drains selection lines DSL.

At this time, since intervals between the wordlines WL0~WLn, between the wordline WL0 and the source selection line SSL, and between the wordline WLn and the drain selection line DSL are relatively narrow, the oxide film tends to remain therein without being clearly etched away. While the first spacers 203 are also formed even between the lines, they are settled, filling the spaces among the wordlines, and before the source and drain selection lines because the spaces among the lines are narrow. Thus, the first junction regions 202 are filled while the common source line 202s between the source selection lines SSL and the drain region 202d between the drain selection line DSL are partially filled.

Figure 2D:
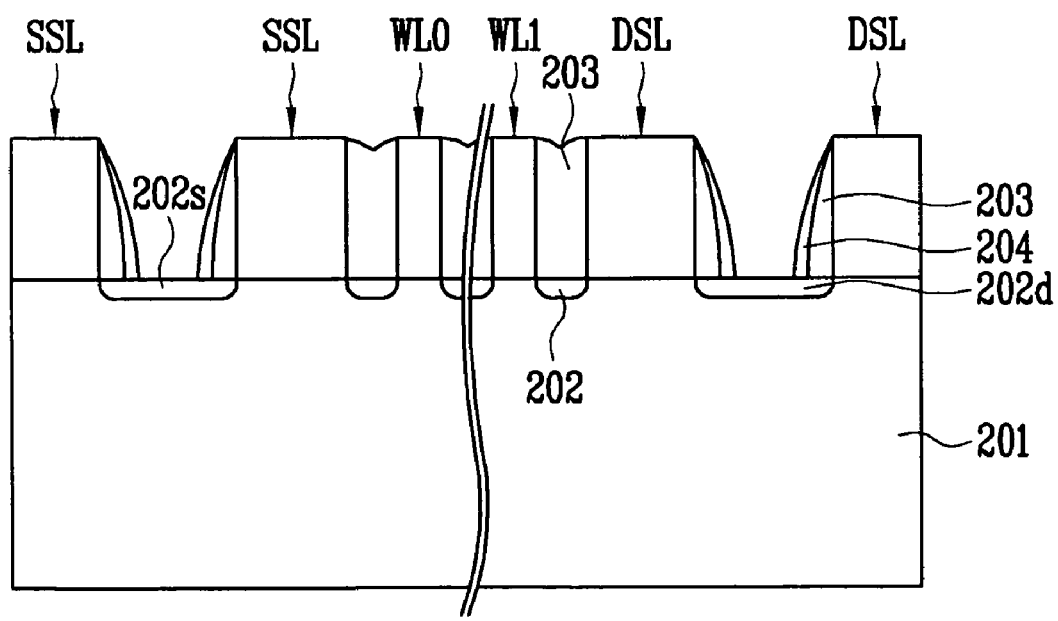

Next, referring to FIG. 2D, second spacers 204 are formed on sidewalls of the source selection line SSL over the common source region 202s and sidewalls of the drain selection line DSL over the drain region 202d. In detail, after a nitride ($Si_3N_4$) film is formed on the overall structure of the substrate, a blanket etch-back process is conducted to remain the nitride film just on sidewalls of the source selection line SSL over the common source region 202s and sidewalls of the drain selection line DSL over the drain region 202d. The thickness of the nitride film is variable in accordance with an integration density of the device, preferably in the range of 100 Å through 1000 Å. During this, as the first spacer 203 located over the first junction region 202 keeps the almost same height with the wordlines WL0~WLn, the first spacer 203 over the first junction region 202 are entirely removed therefrom.

Meanwhile, as the distance between a second junction region 205 (FIG. 2E) and a selection line which will be formed by the subsequent processing steps is dependent upon the thicknesses of the first and second spacers 203 and 204, it is preferred to optimize the thicknesses of the first and second spacers 203 and 204.

Figure 2E:
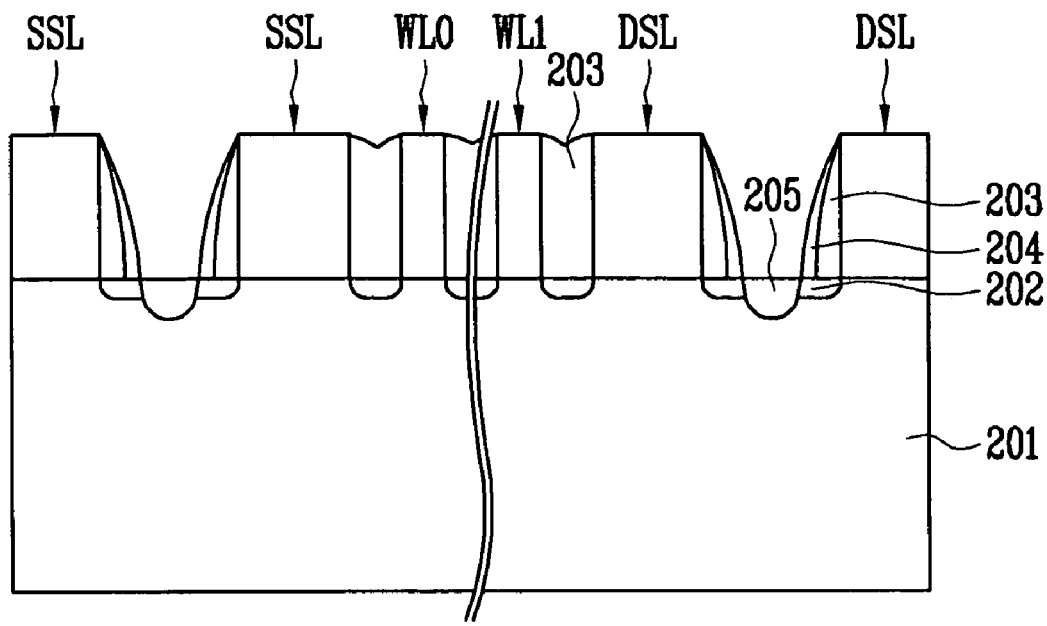

Referring to FIG. 2E, second junction regions 205 are formed in the semiconductor substrate 201 between the source selection lines SSL and between the drain selection lines DSL. The impurity concentration of the second junction region 205 is higher than that of the first junction region 202. And, the second junction region 205 is settled deeper than the first junction region 202.

Figure 2F:
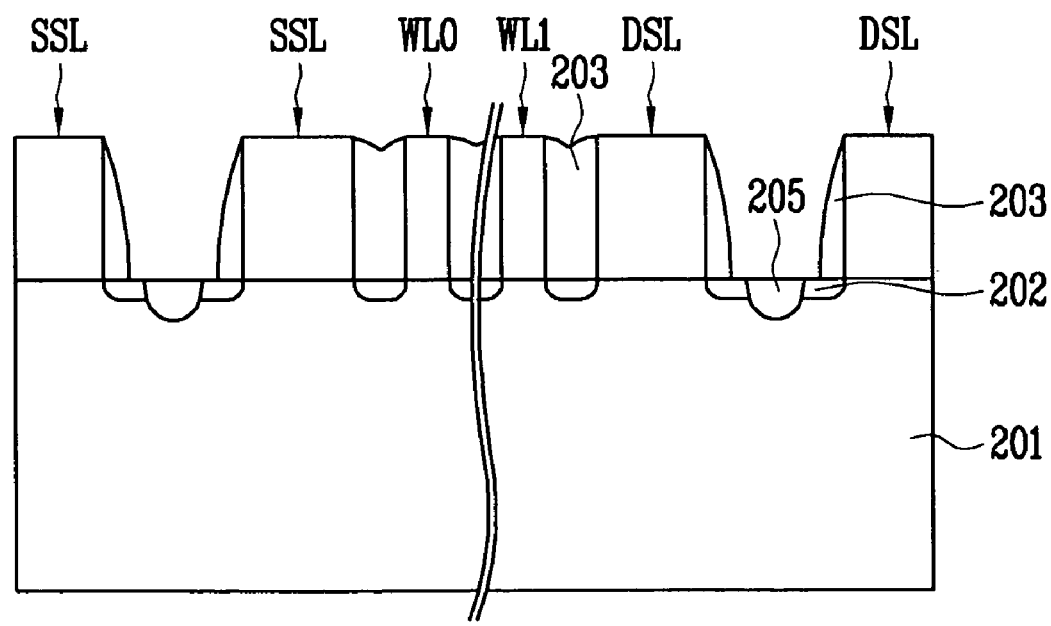

Subsequently, referring to FIG. 2F, plugs are formed over the common source region 202s and the drain region 202d. During this, the second spacers 204 are removed in order to ensure a wider space for the plugs. The second spacers 204 may be removed by means of a wet etching process utilizing phosphoric acid ($H_3PO_4$). Here, the wet etching process may be conducted for one minute through thirty minutes to completely remove the second spacers 204.

As a result, the spaces between the wordlines WL0~WLn are filled only with the oxide films for the first spacers 203. And, the first spacers 203, which are made of an oxide film with a lower dielectric constant than a nitride film, remain on the sidewalls of the source and drain selection lines SSL and DSL. The first spacers 203 remaining on the sidewalls of the source and drain selection lines SSL and DSL are used as contact-buffering spacers, minimizing interference during a programming operation and ensuring the spaces for the plugs at most.

FIGS. 3A through 3F are sectional diagrams illustrating processing steps by a method of manufacturing a flash memory device in accordance with a second embodiment of the present invention.

Figure 3A:
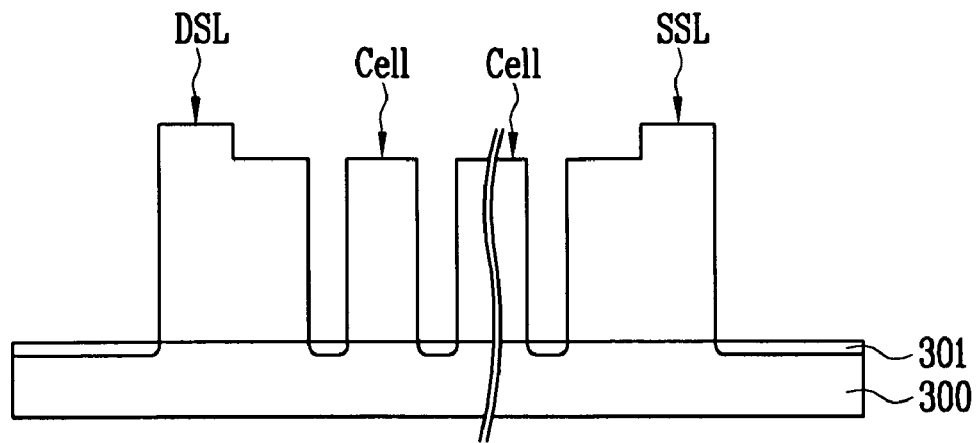
FIGS. 3A through 3F are sectional diagrams illustrating processing steps by a method of manufacturing a flash memory device in accordance with a second embodiment of the invention.

Referring to FIG. 3A, source and drain selection lines, DSL and SSL, and wordlines ("Cell") are formed with predetermined patterns in a semiconductor substrate 300. Thereafter, ionic impurities with low concentration are implanted into the substrate to form low-concentration impurity regions 301. The low-concentration impurity regions 301 are disposed between the wordlines and between the source and drain selection lines SSL and DSL.

Figure 3B:
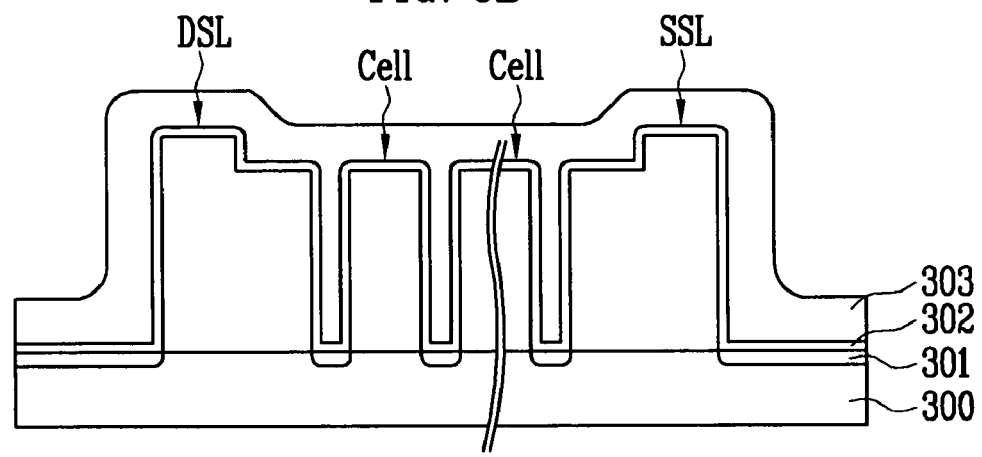

Referring to FIG. 3B, a buffering nitride film 302 is deposited on the entire face of the semiconductor substrate 300 where the source and drain selection lines SSL and DSL and the wordlines (Cell) are formed. The buffering nitride film 302 is provided to prevent abnormal oxidation of the selection lines SSL and DSL and the wordlines (Cell), and also provided to prevent etching damage to the selection lines SSL and DSL and the wordlines (Cell) while removing an oxide film to be formed in the subsequent processing step. Thus, the buffering nitride film 302 need not be thick. The buffering nitride film 302 is preferably deposited by a chemical vapor deposition process (hereinafter, referred to as CVD). During this, it is preferred for the CVD process to be carried out at a temperature of 700° C. to 800° C. under a pressure of 0.3 mTorr through 0.4 mTorr. Subsequently, an oxide film 303 is formed on the buffering nitride film 302. It is preferable for the oxide film 303 to be deposited by a CVD process at a temperature of 800° C. to 900° C.

Figure 3C:
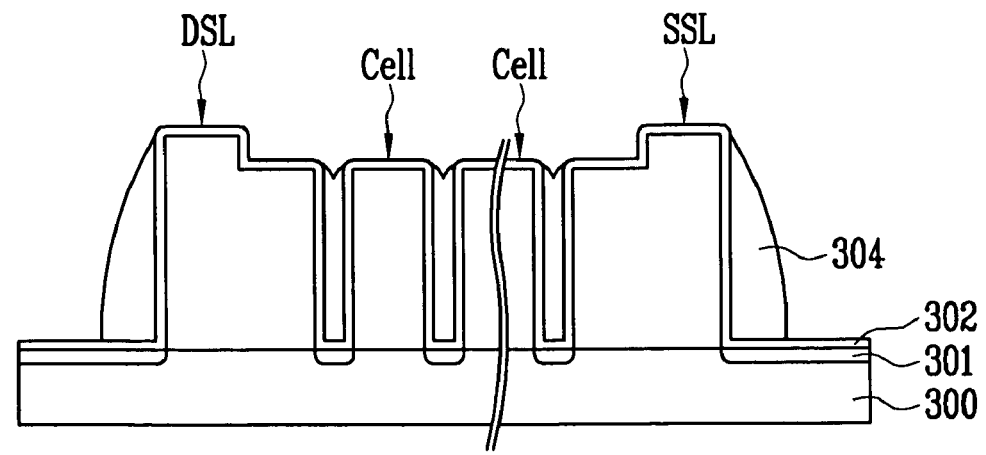

Next, referring to FIG. 3C, the oxide film 303 is partially etched away, remaining on sidewalls of the source and drain selection lines SSL and DSL, resulting in spacers 304 on the sidewalls the source and drain selection lines SSL and DSL.

Figure 3D:
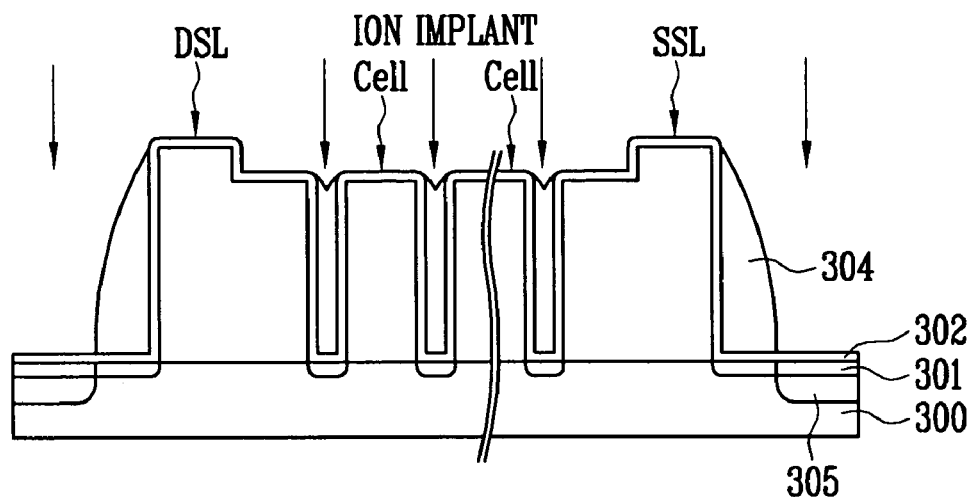

Subsequently, referring to FIG. 3D, ionic impurities with high concentration are injected into the substrate to form source/drain regions 305. During this step, for an NMOS transistor, arsenic (As) is injected thereinto with a dose of 4.0 through 6.0E15 atoms/cm$^2$ at an energy of 20 KeV through 40 KeV. For a PMOS transistor, $BF_2$ is injected thereinto with a dose of 2.0 through 4.0E15 atoms/cm$^2$ at an energy of 30 KeV through 50 KeV.

Figure 3E:
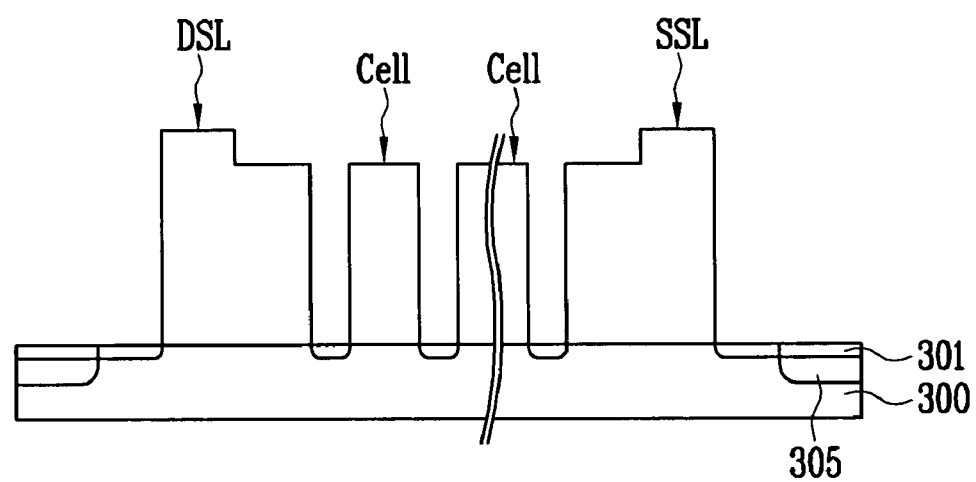

Next, referring to FIG. 3E, the spacers 304 are removed by an etching process. During this step, the spacers 304 are removed, preferably by a wet etching process with using a solution of deionized (DI) water and HF in a ratio of 50:1 through 100:1. It is also possible to dilute the DI water with BOE in preparing the solution for the wet etchant. Here, it is preferable to set the ratio between the DI water and the BOE in 20:1 through 300:1. Thereafter, the buffering nitride film 302 is removed. The buffer nitride film 302 is removed by way of a wet etching process with using phosphoric acid ($H_3PO_4$).

Figure 3F:
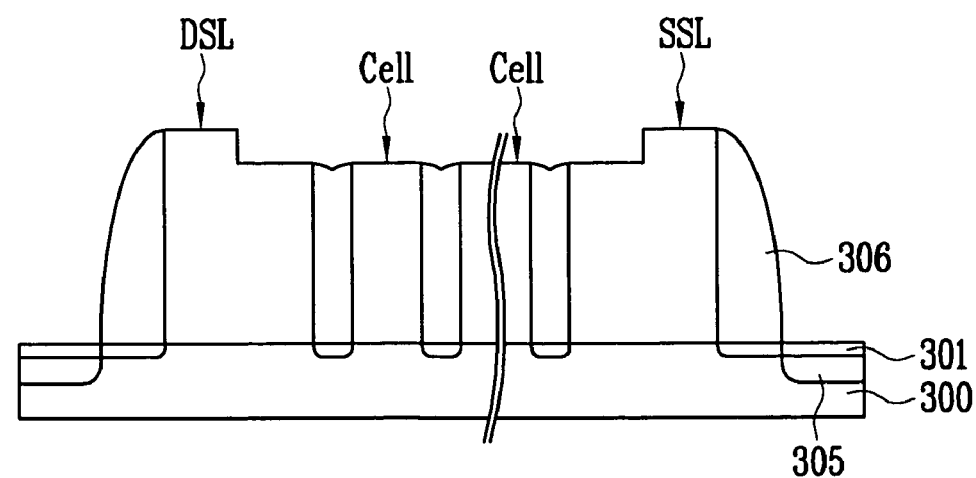

Referring to FIG. 3F, after depositing an oxide film entirely over the semiconductor substrate including the drain and source selection lines DSL and SSL and the wordlines (Cell), contact-buffering oxide spacers 306 are formed on the sidewalls of the drain and source selection lines DSL and SSL by an etching process. During this step, spaces between the wordlines (Cell) are filled up with the oxide film.

As above, the spacers are formed with the stacked structure of the oxide and nitride films on sidewalls of the gate lines, and the oxide film remaining after removing the nitride film, after forming the spacers and the source/drain regions, is used as the contact-buffering spacers on the sidewalls of the gate lines. Thus, the invention minimizes interference arising from the remaining nitride film among the gate lines. And, as spaces for the source/drain regions are obtained by removing the nitride film, the inventive method improves electrical characteristics and integration density in the device. Moreover, as the spacers are formed with the stacked structure of the buffering nitride film and oxide films for the source/drain regions, and the spacers of contact-buffering oxide film are formed on the sidewalls of the gate lines after removing the nitride film, after forming the spacers and the source/drain regions. Thus, the invention minimizes the interference arising from the remaining nitride film among the gate lines and lessens the disturbance of threshold voltages.

Although the invention has been described in connection with the embodiment of the invention illustrated in the accompanying drawings, it is not limited thereto. It will be apparent to those skilled in the art that various substitution, modifications and changes may be thereto without departing from the scope and spirit of the invention.

What is claimed is:

1. A method of manufacturing a flash memory device, comprising the steps of:
   forming first junction regions in active regions of a semiconductor substrate comprising source selection lines, wordlines, and drain selection lines, said source selection lines and drain selection lines having sidewalls, and said source selection lines, wordlines, and drain selection lines being spaced from each other;
   forming first spacers with an insulation film on sidewalls of the source and drain selection lines, the insulation film filling spaces between the wordlines, between the wordlines and the source selection lines, and between the wordlines and the drain selection lines;
   forming second spacers on the first spacers on the sidewalls of the source and drain selection lines;
   forming second junction regions in the first junction regions among the second spacers; and
   removing the second spacers.

2. The method as set forth in claim 1, wherein the insulation film comprises an oxide film.

3. The method as set forth in claim 2, comprising forming the insulation film with the least thickness to fill the spaces among the wordlines, between the wordlines and the source selection lines, and the wordlines and the drain selection lines.

4. The method as set forth in claim 1, wherein the second spacers comprise a nitride film.

5. The method as set forth in claim 1, comprising establishing the thicknesses of the first spacers and second spacers on a target distance between the second junction region and one of the source and drain selection lines.

6. The method as set forth in claim 1, comprising removing the second spacers by a wet etching process using phosphoric acid.

7. A method of manufacturing a flash memory device, comprising:
   forming a low-concentration impurity region in a semiconductor substrate comprising pluralities of spaced wordlines and selection lines are formed, said selection lines defining sidewalls;
   forming a buffering nitride film entirely over the semiconductor substrate including the wordlines and the selection lines;

forming oxide-film spacers on sidewalls of the selection lines by an etching process after forming an oxide film on the buffering nitride film;

forming source/drain regions in predetermined areas of the semiconductor substrate by an ion implantation process with using the oxide-film spacers;

removing the oxide-film spacers and the buffering nitride film; and forming contact-buffering oxide-film spacers on the sidewalls of selection lines, filling up spaces among the wordlines.

8. The method as set forth in claim 7, comprising removing the oxide-film spacers by a wet etching process with using a solution of $H_2O$ and HF mixed in a ratio of 50:1 through 100:1 ($H_2O$:HF).

9. The method as set forth in claim 7, comprising removing the oxide-film spacers by a wet etching process with using an HF solution of $H_2O$ and BOE mixed in a ratio of 20:1 through 300:1 ($H_2O$:BOE).

10. The method as set forth in claim 7, comprising removing the buffering nitride film by a wet etching process with using phosphoric acid.

* * * * *